United States Patent
Szczyrbowski et al.

(10) Patent No.: US 6,814,839 B2
(45) Date of Patent: Nov. 9, 2004

(54) INTERFERENCE LAYER SYSTEM

(75) Inventors: Joachim Szczyrbowski, Goldbach (DE); Günter Bräuer, Freigericht (DE)

(73) Assignee: Unaxis Deutschland Holding GmbH, Hanau (DE)

( * ) Notice: Subject to any disclaimer, the term of this patent is extended or adjusted under 35 U.S.C. 154(b) by 0 days.

(21) Appl. No.: 10/067,711

(22) Filed: Feb. 5, 2002

(65) Prior Publication Data

US 2002/0070106 A1 Jun. 13, 2002

Related U.S. Application Data

(63) Continuation of application No. 08/959,633, filed on Oct. 28, 1997, now Pat. No. 6,451,178.

(30) Foreign Application Priority Data

Oct. 28, 1996 (DE) ......................................... 196 44 752

(51) Int. Cl.⁷ .............................................. C23C 14/34
(52) U.S. Cl. ................................................ 204/192.12
(58) Field of Search ....................... 204/192.12, 192.15, 204/192.22, 298.06

(56) References Cited

U.S. PATENT DOCUMENTS 5,169,509 A * 12/1992 Latz et al. ............. 204/298.03
5,415,757 A * 5/1995 Szcyrbowski et al. . 204/298.08

OTHER PUBLICATIONS

Scherer et al., "Reactive alternating current magnetron sputtering of dielectric layers", pp. 1772–1776 (1992).*

Vossen et al., "Thin Film Processes", pp. 61–62 (1978).*

* cited by examiner

Primary Examiner—Steven Versteeg
(74) Attorney, Agent, or Firm—Fulbright & Jaworski L.L.P.

(57) ABSTRACT

A process is provided for sputter-induced precipitation of metal oxide layers on substrates by means of a reactive sputter process. The plasma charge acting upon the target to be evaporated is provided with electric power selected such that the metal oxide layers precipitated on the substrates to be coated are deposited at a precipitation rate of $\geq 4$ nm/s. During the coating process the substrate to be coated is arranged stationary in relation to the target material to be evaporated. The electrodes are connected in a conductive manner to the outputs of an alternating current source whereby the alternating frequency of the alternating current provided for the electrical supply of the plasma discharge is selected between 10 kHz and 80 kHz. Particularly preferred is that the precipitated oxide layer is a $TiO_2$ layer or an $SiO_2$ layer.

2 Claims, 11 Drawing Sheets

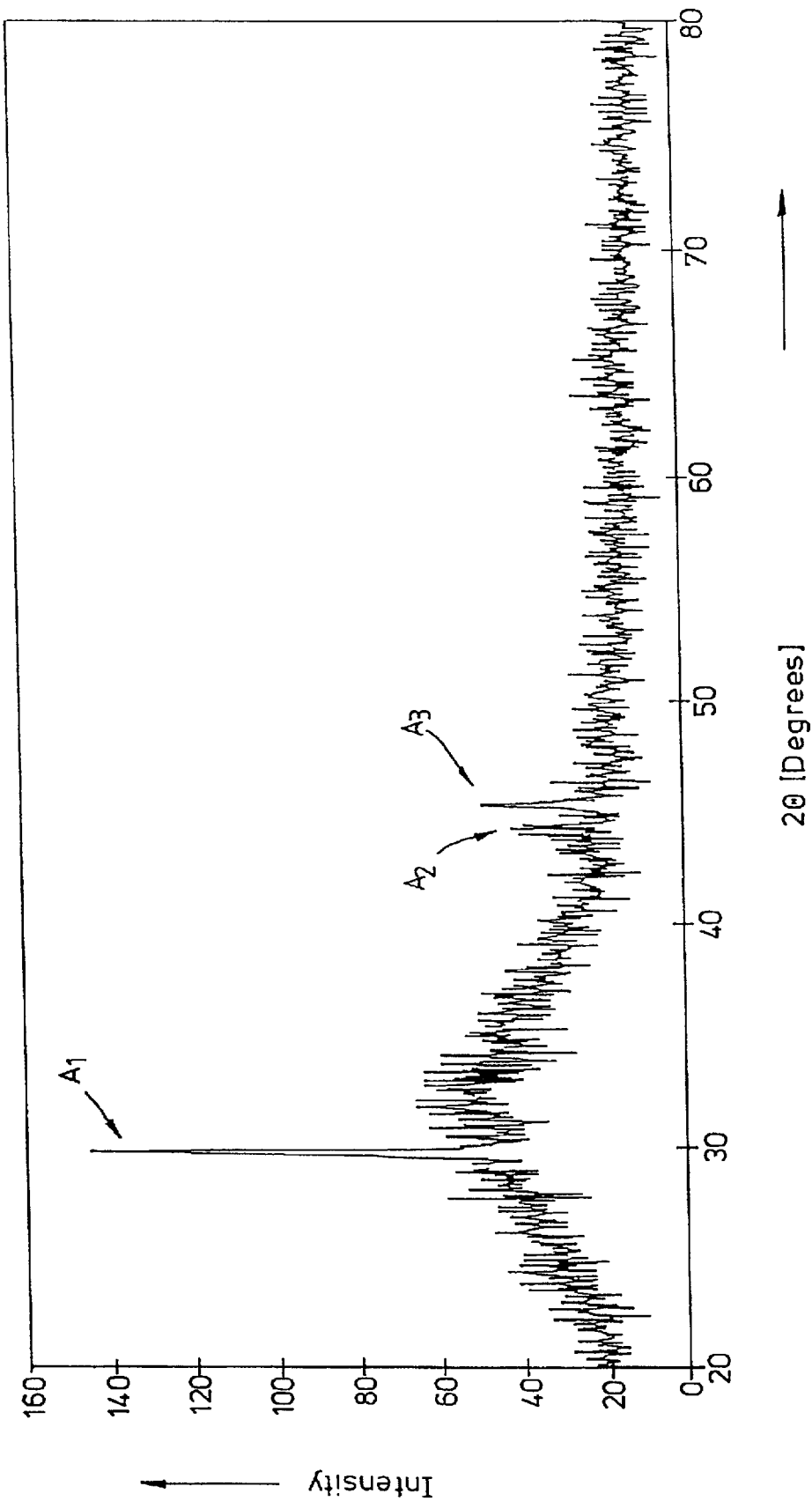

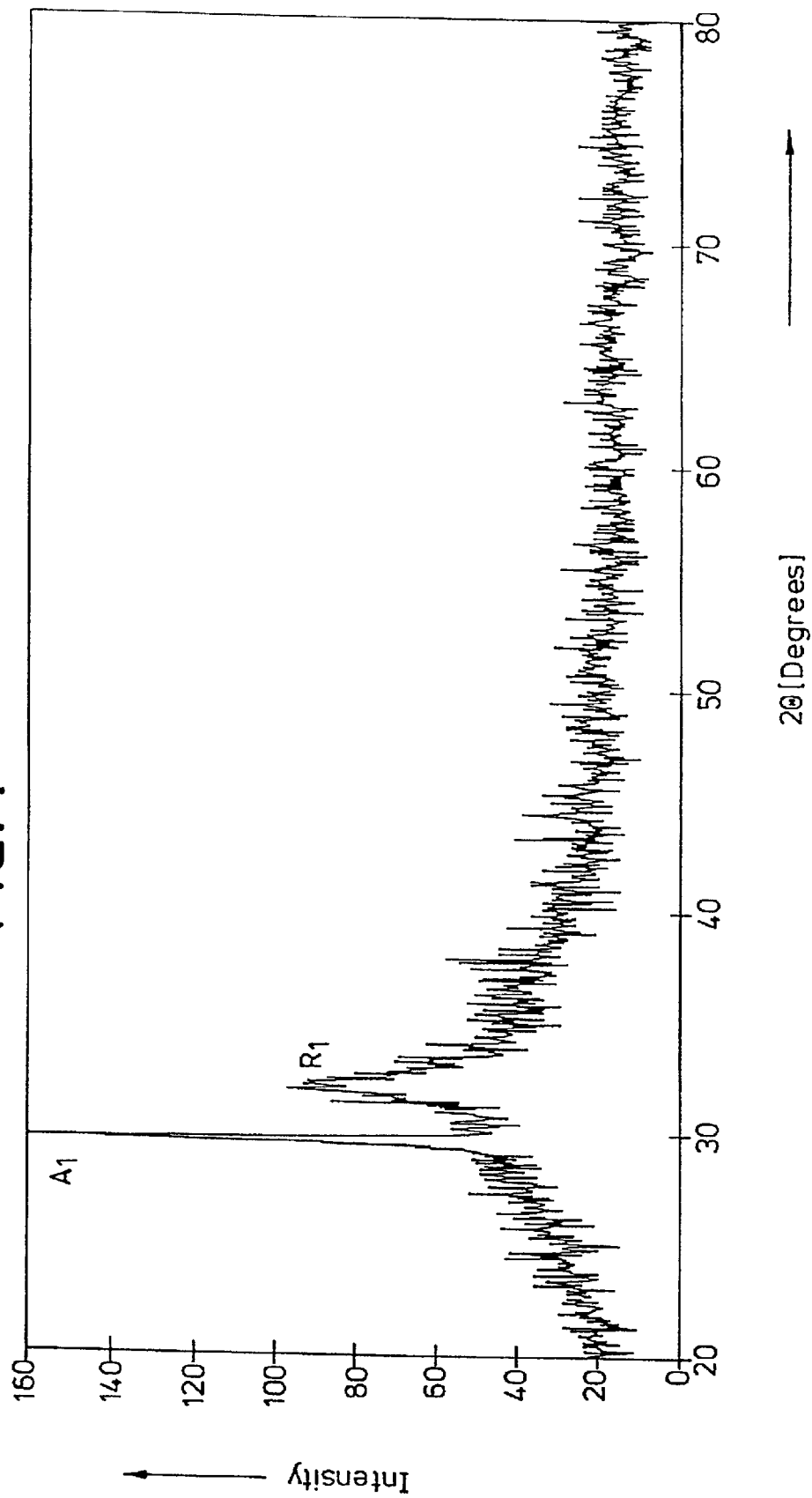

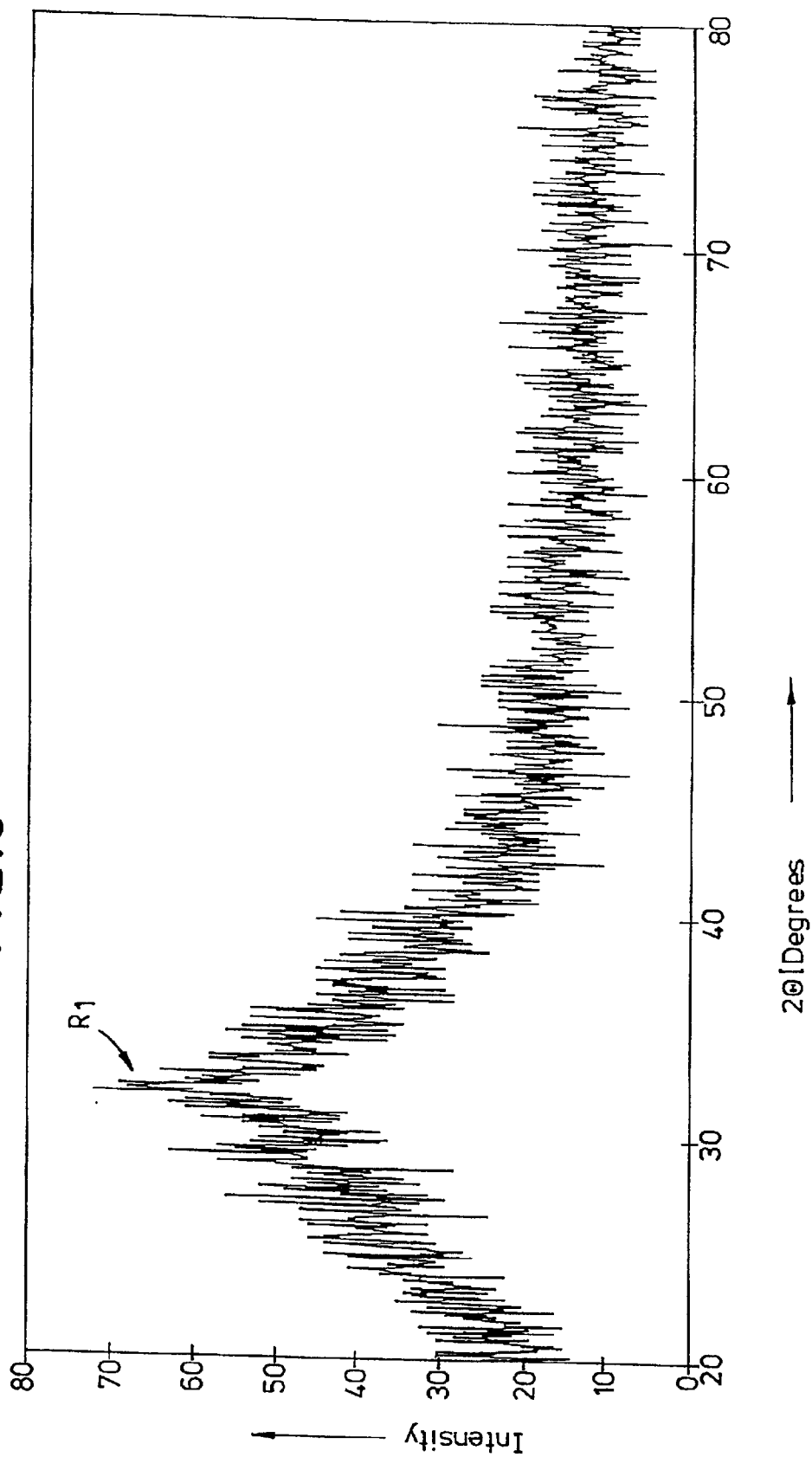

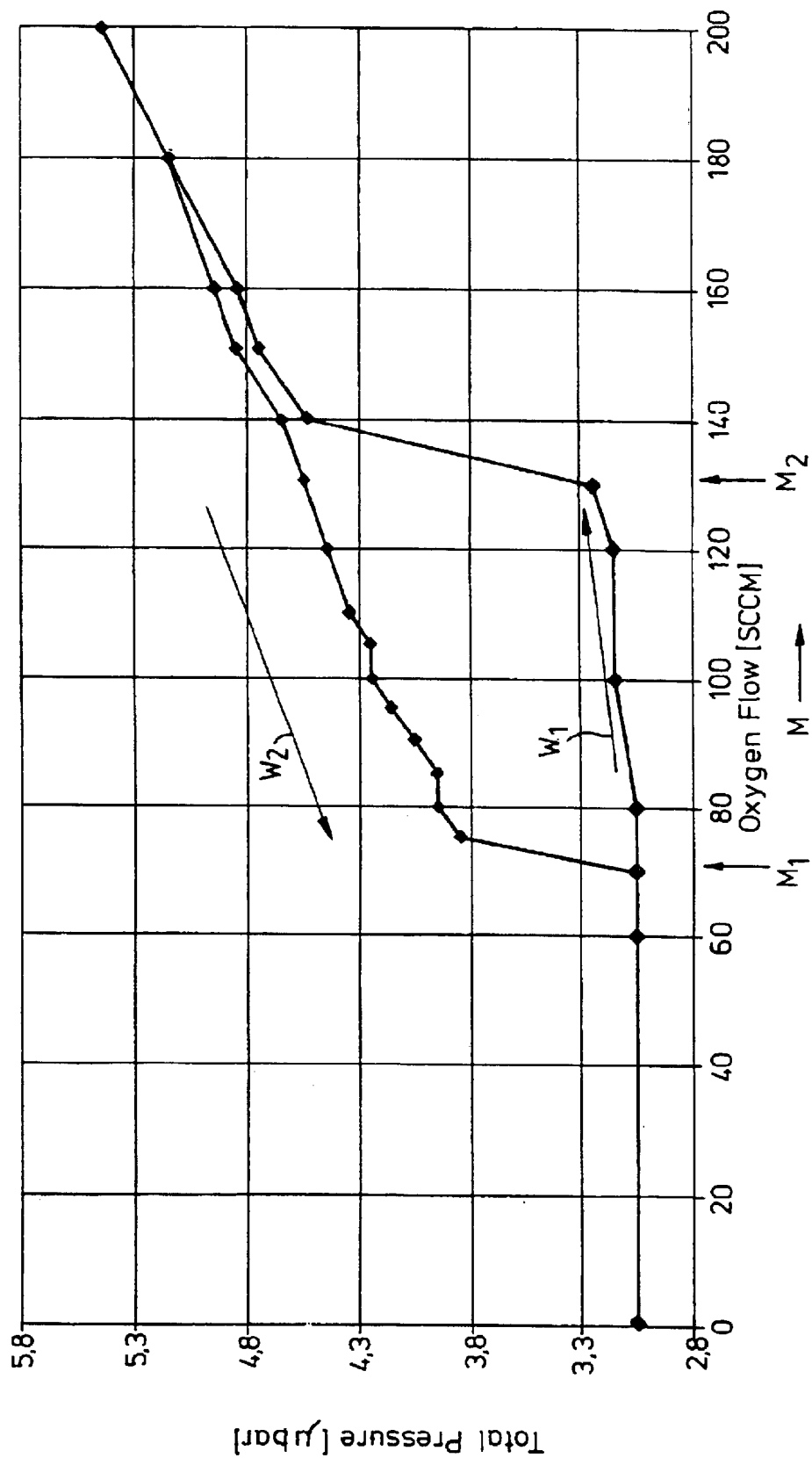

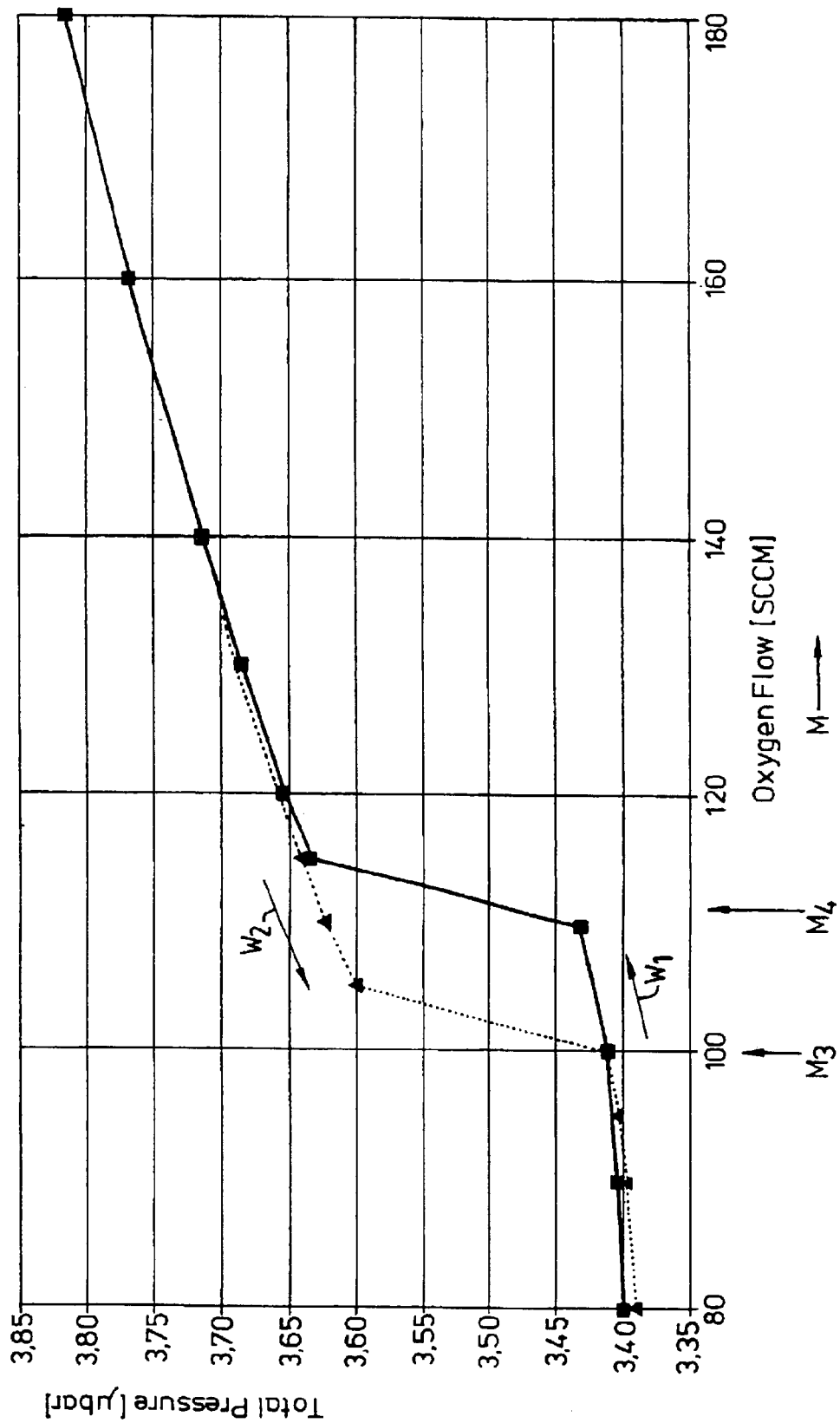

INTERFERENCE LAYER SYSTEM

FIELD OF THE INVENTION

This application is a continuation of application Ser. No. 08/959,633 filed Oct. 28, 1997, now U.S. Pat. No. 6,451,178 B2.

DESCRIPTION OF THE PRIOR ART

Methods of manufacture of this kind and single-layer systems manufactured according to this process are known. By means of a sputter device as described for example in DE 4,106,770, substrates are coated by means of cathode sputtering, preferably by magnetron cathode sputtering, where so-called targets are exposed to the action of a plasma cloud which forms between two electrodes, and where the evaporated target material which shows affinity to the reactive gas, forms a chemical bond with the gas and precipitates upon the substrate. In the known sputter methods the target is for example the one electrode and the substrate the other electrode which is connected electrically to both outputs of an electric power supply device. As an alternative, so called double electrodes are also used, which electrodes are alternately switched as anode and cathode. Electric power is supplied to the electrodes either as direct current or as alternating current, as described for example in DE OS 3,802,852.

For precipitation of dielectric layers such as for example $SiO_2$, $Al_2O_3$, $ZrO_2$, $TiO_2$, $ZnO_2$, the target to be evaporated is composed of the corresponding metal components present in the above compounds and is acted upon by the plasma cloud composed for example of $Ar/O_2$ or $Ar/N_2$ mix, which action evaporates the metal target.

A problem long known in the use of the generic sputter methods has been to provide homogenous and uniformly composed layers of high optical quality reproducible for industrial use. Thus dielectric layers such as for example $SiO_2$, $Al_2O_3$, or especially $TiO_2$, deposited for example by the DC sputter method on glass surfaces or optical components, have shown less than the desired resistance to environmental conditions, such as for example humidity acting upon the layers. Sputter and coating techniques realized by means of the DC sputter method additionally cause in a disadvantageous manner long and therefore expensive coating times during which the process parameters defining the coating process must be held constant. In addition, the optical properties of layer systems produced using conventional sputter methods have proved inadequate increasingly exacting requirements.

SUMMARY OF THE INVENTION

An object of the present invention is to provide a method of sputter-induced production of metal oxide layers on substrates by means of a reactive sputter process through which metal oxide layers of high optical quality can be made available for industrial manufacture in a reproducible and cost-efficient manner.

According to the invention, the object is accomplished by a method of this kind as mentioned in the introduction in that electric power is applied to the plasma charge acting upon the sputter target to be evaporated by means of at least two electrodes arranged in the vicinity of each other in the plasma reaction space, and where electric power is selected such that oxide layers to be precipitated on the substrate to be coated are deposited at a coating rate of >4 nm/s, whereby during the coating process the substrate to be coated is arranged stationary in relation to the target material to be evaporated. A coating rate of >40 nm m/min is proposed for substrates which during the coating process are to be moved in front of the sputter target as in so-called continuous systems. Metal oxide layers produced according to the method of the invention exhibit, surprisingly enough, several advantages vis-a-vis metal oxide layers produced by conventional sputtering. Thus it was found that $TiO_2$ layers produced according to the invention had a refractive index n between 2.55 and 2.60. Conventional DC technique only produced n values between 2.35 and 2.45. Metal oxide layers having a high n value advantageously allow a thinner metal oxide layer than one produced by conventional methods in order to achieve an effect dependent on the refractory value. In addition, thinner metal oxide layers have the advantage of high light transmission and color neutrality in the visible spectrum. Moreover, thin metal oxide layers can be produced more cost-effectively than conventional metal oxide layers.

Layers produced according to the invention also advantageously exhibit a very smooth surface. Surface structure morphology of metal oxide layers produced according to the invention exhibits a very compact crystalline definition which demonstrates high resistance to chemically reactive substances. Metal oxide layers produced according to the invention are correspondingly more resistant to the effects of humidity than conventional sputter layers produced for example by means of a plasma discharge. Furthermore it was found that by using sputter plasma operated with alternating current the precipitated $TiO_2$ layers crystallized primarily in a reactive structure. Contrary to the anatase structure of the $TiO_2$ layer which primarily forms in DC sputter process, the rutile structure is temperature-stable up to 1855° C., while the anatase structure undergoes a phase conversion at 642° C. and exhibits an unstable structure. It has been further shown that given equal plasma output, the process according to the invention achieves a sputter rate about 6 to 7 times higher than that of conventional DC sputter process.

Metal oxide layers produced according to the invention can also be used for improved low-E layer systems and for so-called solar-control systems with improved optical properties. In the case of low E layers the possibility is created advantageously to forgo tin as the target material in favor of economical titanium. Since $SnO_2$ layers produced by the sputter process disadvantageously tend to develop islands, it is desirable to substitute $TiO_2$ for $SnO_2$. In the case of low-E layer systems the base layer applied directly on the substrate exhibits according to the invention a smooth and compact surface structure onto which the actual low E layer is applied, for example a silver or gold layer. Morphology of the base layer produced according to the invention also advantageously promotes the forming of an applied metal layer which exhibits high conductivity or a low k value, respectively.

It has been shown to be advantageous for the production of layers according to the invention to select a frequency of the alternating current supplying the sputter plasma between 10 kHz and 80 kHz.

Additional advantageous features of the method and possible uses of metal oxide layers according to the invention are characterized in the following description.

BRIEF DESCRIPTION OF THE DRAWINGS

The invention includes various possible embodiments. Several especially advantageous exemplary embodiments are represented in the drawings and are described in more detail below. There are shown in FIG. 1a Scanning electron microscope image of the surface of a TiO$_2$ layer produced according to prior art, viewed at an angle;

FIG. 1b enlarged portion of the TiO$_2$ layer shown in 1a;

FIG. 2 an X-ray diffraction spectrum of the TiO$_2$ layer shown in 1a, 1b;

FIG. 3b a scanning microscope image of a cross-section of the TiO$_2$ layer shown in 3a;

FIG. 4 an X-ray diffraction spectrum of the TiO$_2$ layer shown in 3a, 3b;

FIG. 5b a scanning microscope image of a cross-section of the TiO$_2$ layer shown in 5a;

FIG. 8 an X-ray diffraction spectrum of the TiO$_2$ layer shown in 7a, 7b;

FIG. 9 the characteristic curve of a high output DC cathode;

FIG. 10 the characteristic curve of a dual magnetron cathode and

DETAILED DESCRIPTION

Figure 1A:
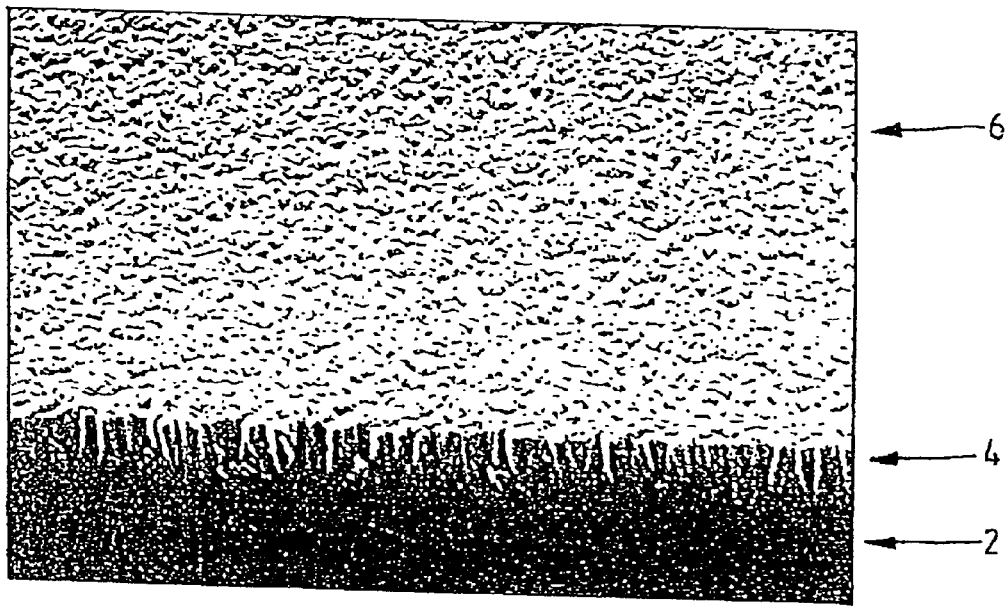
Figure 1B:
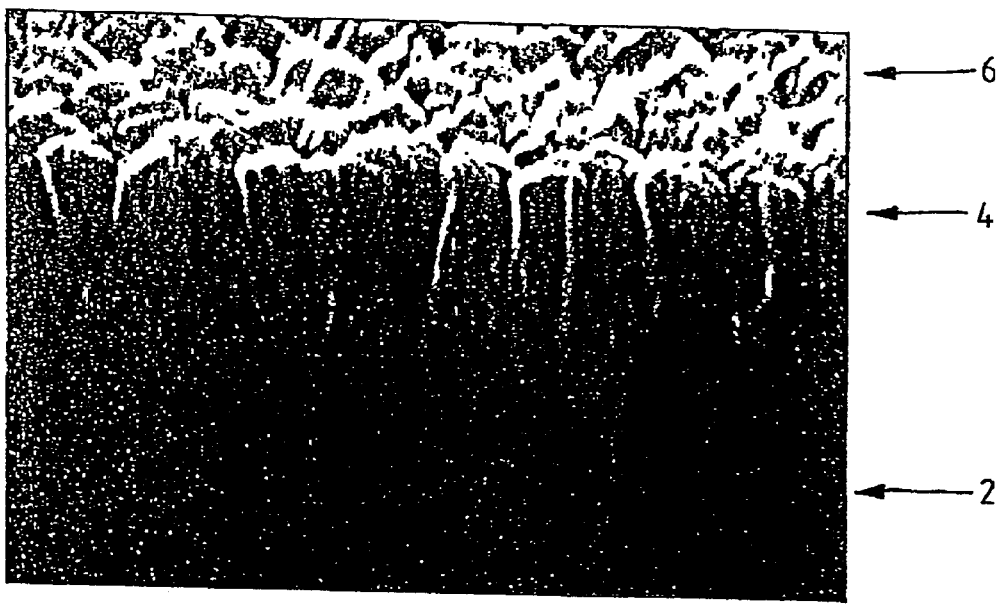

A TiO$_2$ layer 4, 6 produced by conventional DC sputter method in shown in FIGS. 1a and 1b in various enlargements of a scanning microscope image. The TiO$_2$ layer is applied on an Si wafer 2 and exhibits a layer thickness of approximately 500 nm. The TiO$_2$ layer 4, 6 grown by means of reactive DC magnetron sputtering with addition of an Ar/O$_2$ gas mixture consists of single columnar microcrystallites which are arranged substantially parallel to each other on the substrate. The surface of the TiO$_2$ layer 4, 6 possesses a pronounced surface roughness. The X-ray crystallographic analysis of the TiO$_2$ layer 4, 6 shown in FIGS. 1a, 1b is represented as a Debye-Scherer diagram in FIG. 2. Diffraction reflexes $A_1$, $A_2$ and $A_3$ which dominate in FIG. 2 are characteristic of the anatase structure of TiO$_2$. Accordingly, reflex $A_1$ represents grid net planes assigned to the anatase structure 101 and fulfilling the Bragg reflexion conditions, reflex $A_2$ those of anatase structure 004, and reflex $A_3$ those of anatase structure 112.

Figure 3A:
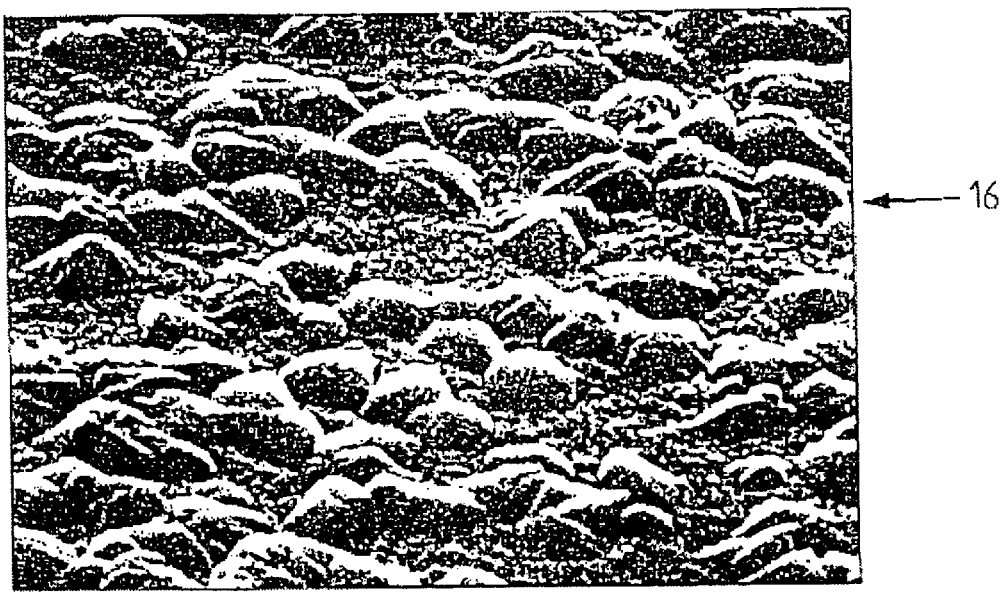
FIG. 3a a scanning microscope image of a TiO$_2$ layer applied at a dynamic coating rate of 21 nm m/min and a viewing angle of 60° in relation to the normal of the surface.
Figure 3B:
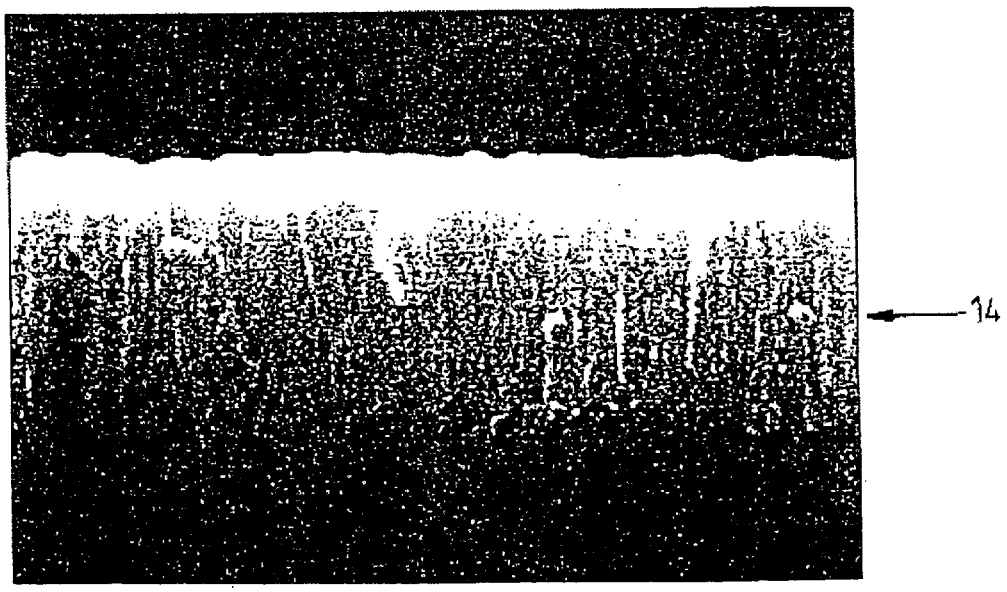

A TiO$_2$ layer produced by means of a reactive sputter process with a coating rate of 21 nm m/min as proposed according to the invention is shown in FIGS. 3a and 3b. TiO$_2$ layer 14 (see FIG. 3b) has a thickness of about 500 nm and in comparison to the layer structure shown in FIG. 1b, exhibits only weakly defined and locally limited columnar TiO$_2$ microcrystallites. Surface 16 shown in FIG. 3a exhibits in places surface sites which have only a small depth of roughness. The crystalline composition of TiO$_2$ layer 14 shown in FIGS. 3a, 3b, applied to a glass substrate, is evident in the Debye-Scherer diagram (FIG. 4), which, beside the known anatase 101 structure ($A_1$), also shows the diffraction reflex $R_1$, which corresponds to the Bragg reflection in a 110 grid net plane of a TiO$_2$ layer crystallized in a rutile structure. The rutile structure therein corresponds to the areas of low surface roughness appearing in FIG. 3a, while in contrast, the anatase 110 structure corresponds to the island formations appearing in FIG. 3a.

Figure 5A:
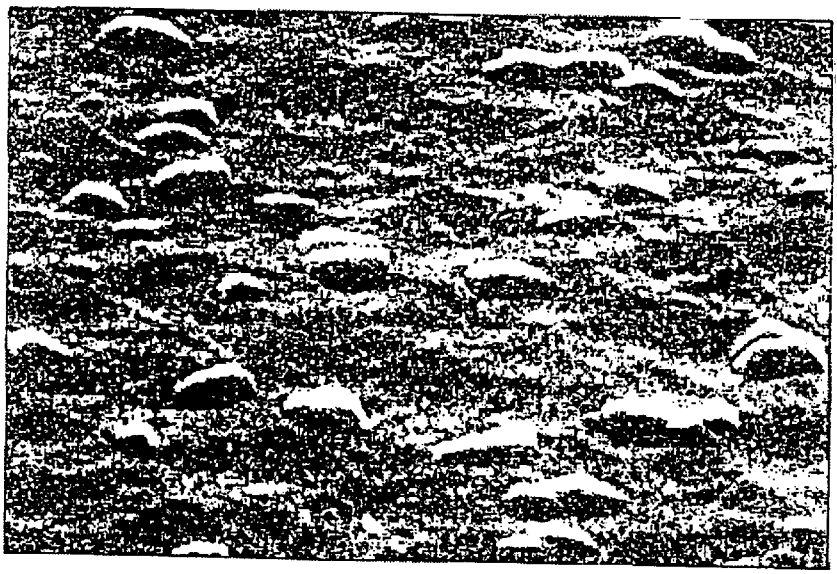
FIG. 5a a scanning microscope image of a TiO$_2$ layer applied at a dynamic coating rate of 37 nm m/min.
Figure 5B:
Figure 6:
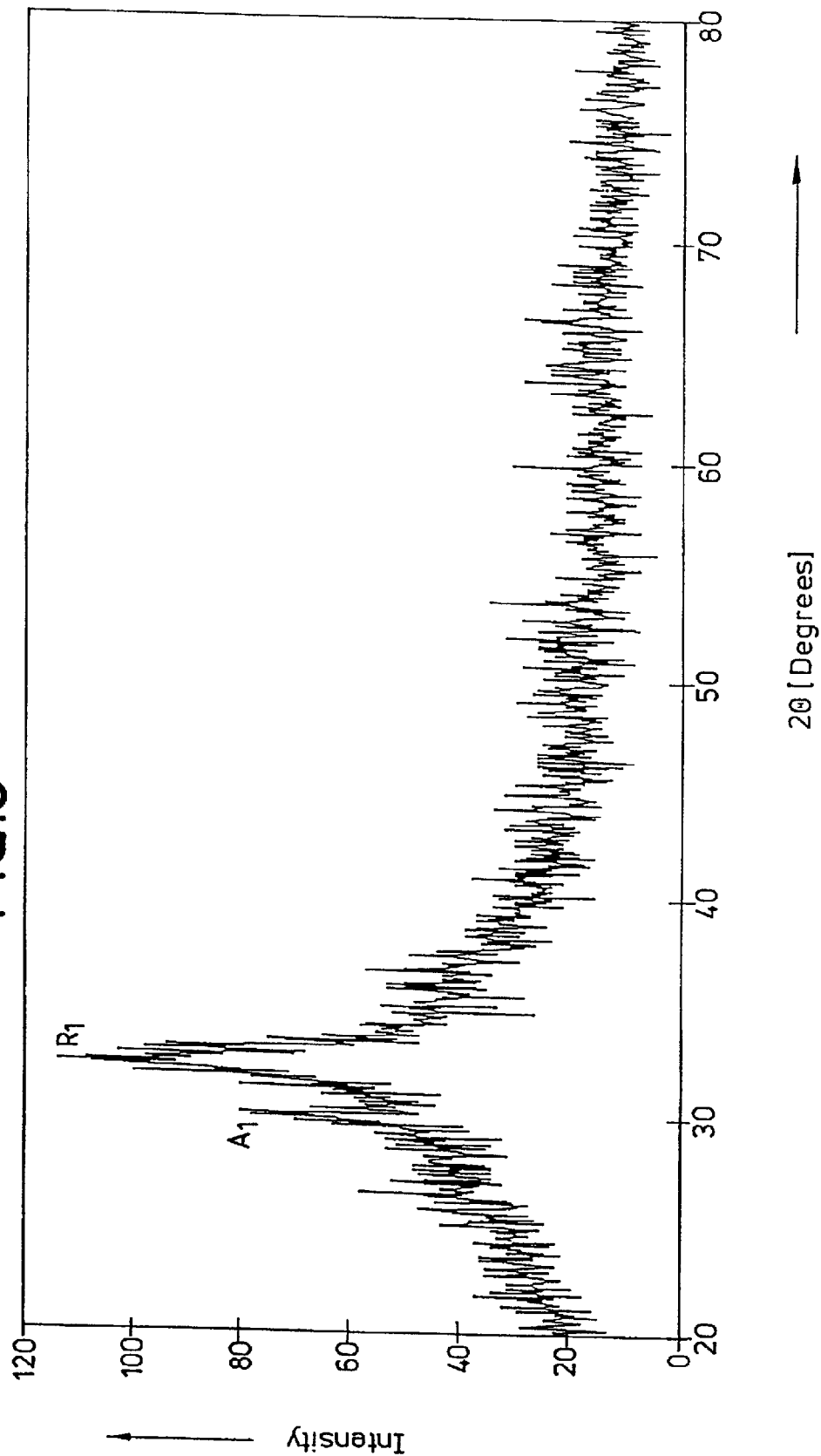
FIG. 6 an X-ray diffraction spectrum of the TiO$_2$ layer shown in 5a, 5b.

A TiO$_2$ layer 24, 26, applied to a glass substrate with a application rate of 37 nm m/min is shown in FIG. 5a. In comparison to TiO$_2$ surfaces 14, 4, 6 shown in FIG. 3a and FIG. 1a, only occasional micro-crystalline island formations appear with the higher coating rate. Column formations corresponding to the micro-crystalline island formations are no longer present in the cross-sectional view shown in FIG. 5b. This result is also confined by the corresponding X-ray diffraction spectrum (see FIG. 6). Accordingly, in the corresponding 1(2θ) diagram, the rutile structure clearly dominates vis-a-vis the competing anatase 101 structure.

Figure 7A:
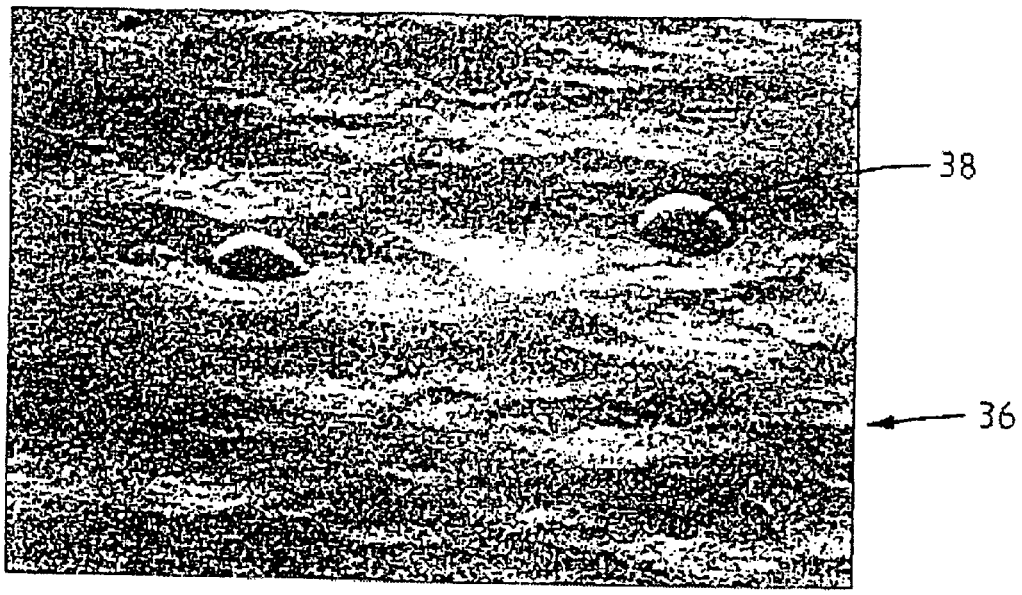
FIG. 7a a scanning microscope image of a TiO$_2$ layer applied by reactive sputter at a layer growth rate of 49 nm m/min.
Figure 7B:
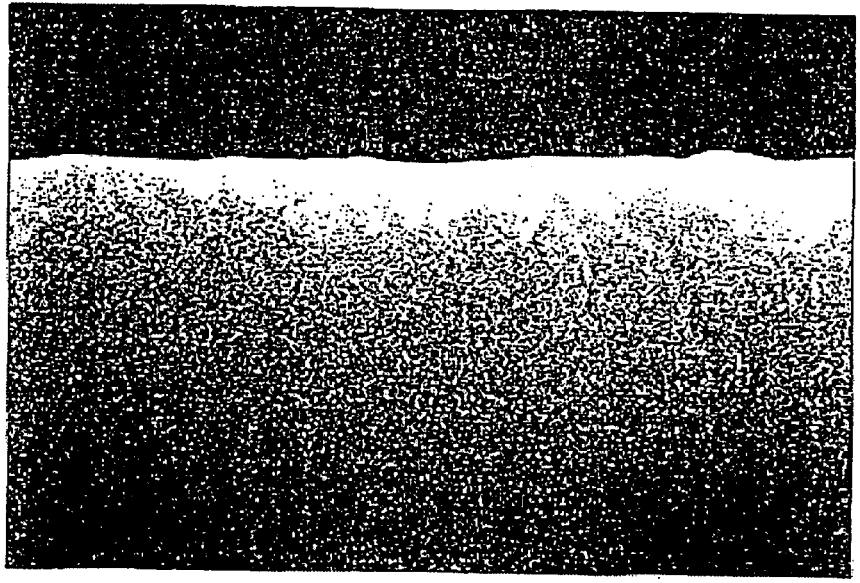
FIG. 7b a scanning microscope image of a cross-section of the TiO$_2$ layer shown in 7.

An even stronger definition of the rutile structure can be seen in FIGS. 7a and 7b. The TiO$_2$ layer, with a thickness of approximately 500 nm, applied on a glass substrate, is composed almost entirely of rutile structures, as can be deduced from the corresponding X-ray diffraction spectrum in FIG. 8 on the basis of the rutile 110 reflex which is the only one present. Surface 36 of the TiO$_2$ layer, applied at a rate of 49 nm m/min, is nearly homogeneously smooth and exhibits only occasional island formations 38. Microcrystalline anatase structures which form columns during growth are no longer visible in the cross-section shown in FIG. 7b.

The substantial difference between reactive sputter process according to prior art and the proposed sputter process according to the invention follows from the comparison of the course of the respective characteristic curves of the cathode of a DC sputter process (see FIG. 9) and a AC sputter process (FIG. 10). FIG. 9 shows the characteristic curve of a high output cathode supplied with direct current, into which cathode a titanium target is integrated. What is shown is the total pressure in the sputter chamber as a function of the O$_2$ gas volume M flowing into the plasma reaction space. The p(M) curve exhibits a hysteresis loop between working points $M_1$ and $M_2$. Two sputter conditions for the DC cathode are possible in the transitional area between the points $M_1$ and $M_2$, i.e. a metallic one which will proceed along route $W_1$, and an oxide sputter condition which is present if following the hysteresis loop in the direction $W_2$. A cathode supplied with direct current uncontrollably jumps between the two modes in the transitional area between the points $M_1$ and $M_2$. Due to the broad transitional area of the hysteresis loop of the p(M) curve shown in FIG. 9, stable sputter conditions needed for high-quality metal oxide layers can only be achieved with the help of expensive process control devices. To achieve maximum sputter rates with a high output DC cathode, a value of the oxygen volume supply is sought in the $M_1$ area, for the selection of the sputter working point, where the metal oxide layers can be produced in the oxide mode.

FIG. 10 shows the characteristic curve of a high output magnetron cathode supplied with alternating current, according to the invention. The figure clearly shows that the transitional area between the working points $M_3$ and $M_4$ has a width of only 10 sccm and is therefore narrower by a factor of 7 than in the case of conventional sputter process (see FIG. 9).

Figure 11:
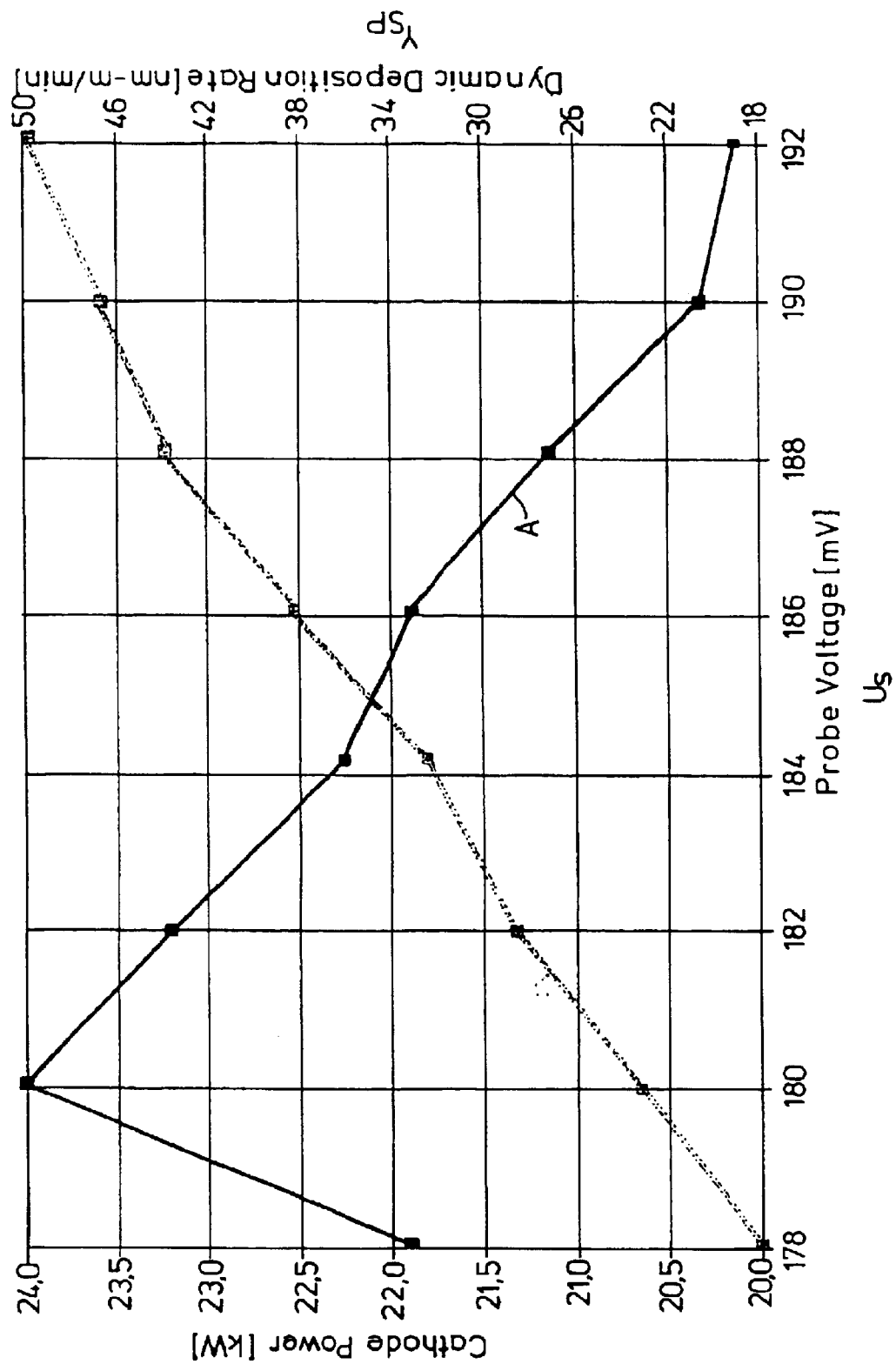
FIG. 11 output curve and sputter rate measured as a function of the probe voltage for a sputter process according to the invention.

FIG. 11 shows measured sputter rates $Y_{sp}$ and cathode output L at a constant oxygen supply of 120 sccm as a function of probe voltage $U_s$ for a sputter process according to the invention. According to the measuring process a higher probe voltage $U_s$ corresponds to a lower oxygen proportion in the sputter chamber. It can be observed that the higher the probe voltage $U_s$, the more metallic the burning of the cathode. The sputter rate rises advantageously with falling oxygen volume and at the same time the cathode output falls (see curve run A). An oxygen sensor serves for the regulation of the sputter process, which sensor provides the probe voltage $U_s$ as an actual value assigned to a control circuit. FIG. 11 shows that rising sputter rates $Y_{sp}$ are realized with a smaller cathode output L. This significantly increases the efficiency of the sputter arrangement according to the invention.

What is claimed is:

1. A method for sputter-induced deposition of metal oxide layers on substrates by means of a reactive sputtering process comprising:

supplying an electrical output to a plasma discharge acting on a sputter target to be deposited by means of at least two electrodes arranged adjacent to one another in a plasma reaction space, wherein said electrical output is selected such that the metal oxide layers to be deposited on the substrate to be coated are deposited at a layer growth rate of $\geq 4$ nm/s; wherein the substrate to be coated is arranged during the coating process stationary in relation to a target material to be deposited; wherein the electrodes are connected electrically conductively to the outputs of an alternating current source; wherein the alternating frequency of the alternating voltage for the electrical supply to the plasma discharge is between 10 kHz and 80 kHz; and wherein a transitional area in a hysteresis loop of the p(M) curve between working points with metallic and oxide sputter conditions has a width of less than or equal to 10 sccm, wherein an oxygen sensor provides a probe voltage U, as an actual value to a control circuit that regulates the sputter reactive sputter process.

2. A method for sputter-induced deposition of metal oxide layers on substrates by means of a reactive sputtering process comprising:

depositing oxide layers on a substrate to be coated by reactive sputtering at a layer growth rate of $\geq 40$ nm m/min, wherein said substrate to be coated is moved along in front of a target material to be deposited; wherein electrodes are connected electrically conductively to the outputs of an alternating current source; wherein the alternating frequency of the alternating voltage supplied to the plasma discharge is between 10 kHz and 80 kHz, and wherein a transitional area in a hysteresis loop of the p(M) curve between working points with metallic and oxide sputter conditions has a width less than or equal to 10 sccm, wherein an oxygen sensor provides a probe voltage U, as an actual value to a control circuit that regulates the sputter reactive sputter process.

* * * * *